United States Patent [19]

van de Westerlo

[11] Patent Number: 5,731,740

[45] Date of Patent: Mar. 24, 1998

[54] CIRCUIT BIAS VIA TRANSFORMER

[75] Inventor: Marcel H. W. van de Westerlo, Nijmegen, Netherlands

[73] Assignee: U.S. Philips Corporation, New York, N.Y.

[21] Appl. No.: 650,568

[22] Filed: May 20, 1996

[30] Foreign Application Priority Data

May 31, 1995 [EP] European Pat. Off. .............. 95201429

[51] Int. Cl.$^6$ .............................. H03F 3/26; H01F 27/28
[52] U.S. Cl. ......................... 330/276; 330/122; 336/180; 336/182
[58] Field of Search ..................... 330/276, 122; 336/171, 180, 182, 183, 186

[56] References Cited

U.S. PATENT DOCUMENTS 1,878,742  9/1932  Wheeler ........................ 330/122 X
2,095,294  10/1937  Sola ............................. 336/182 X

OTHER PUBLICATIONS

"High Frequency Circuit Design" J.K. Hardy, Reston Publishing Company, 1979, pp. 181–186 & 316–318.

Primary Examiner—James B. Mullins
Attorney, Agent, or Firm—Steven R. Biren

[57] ABSTRACT

In an amplifier module circuit, an input transformer (TI) transforms an input signal (ISU) into a transformed input signal (ISB), which is supplied to a pair of amplifiers (AMPA, AMPB). In addition to windings (W1, W2) for input signal transformation, the core (CO) of the transformer (TI) is provided with an auxiliary winding (W3) for biasing the pair of amplifiers (AMPA, AMPB). A DC bias voltage (VB) is supplied to a tap (XT) on the auxiliary winding (W3) whose ends are DC coupled to the input transistors (QA, QB) of the pair of amplifiers (AMPA, AMPB).

7 Claims, 1 Drawing Sheet

CIRCUIT BIAS VIA TRANSFORMER

BACKGROUND OF THE INVENTION

The invention relates to a signal-processing circuit comprising a transformer having a magnetic core provided with a primary winding for receiving an input signal and a secondary winding for supplying a transformed input signal to a pair of electric devices in said signal-processing circuit.

Such a signal-processing circuit may be, for example, a CATV amplifier module or any other module for processing high-frequency signals.

The book "High Frequency Circuit Design" by J. K. Hardy, Reston Publishing Company, 1979 describes a balanced mixer circuit which is shown in FIG. 10-6 on page 316. The circuit has a transformer for converting an unbalanced input signal into a balanced signal which is supplied to a differential—or balanced—transistor stage. The primary winding of the transformer has one end to which a reference voltage is applied and another end for receiving the input signal "RF" to be mixed with an oscillator signal "OSC". The two ends of the secondary winding are connected to the respective bases of the transistors of the differential stage. The secondary winding has a tap to which the reference voltage is applied. As a result, the bases are biased at this reference voltage.

In principle, the balanced mixer circuit in the book cited can function for a wide range of input signal frequencies, provided that the transformer has a sufficient wide band. Wide-band transformers are described on pp. 181–186 of the book cited. In wide-band transformers, each turn of the primary winding is kept very close to one of the secondary turns, that is, the wires of the primary and secondary windings remain close together, for example, by twisting the two.

However, the manufacture of a wide-band transformer, one winding of which has a tap, is rather complicated, hence costly. The twisting of primary and secondary windings needs to be interrupted locally. Moreover, such an interruption inevitably affects the high-frequency properties of the transformer, in particular the symmetry in the balanced signal. Poor symmetry may result in a relatively poor performance with respect to even-order distortion.

SUMMARY OF THE INVENTION

It is an object of the invention to provide a signal-processing circuit of the type identified in the opening paragraph, which is relatively easy to manufacture.

In accordance with an aspect of the invention, the core of the transformer in such a signal-processing circuit is provided with an auxiliary winding the ends of which are DC coupled to the pair of electric devices which receive the transformed input signal, said auxiliary winding having a tap which is DC coupled to a voltage source for biasing the pair of electric devices.

Thus, the transformer comprises three windings. Two of those three windings—the primary and the secondary winding—provide AC input signal transformation and the other—auxiliary—winding superimposes a common mode DC bias voltage on the transformed AC input signal. The auxiliary winding on the core provides high-frequency decoupling between the electric devices and the DC bias voltage source. Such a decoupling prevents undesired attenuation of the AC input signal, which could result in an unacceptable noise figure of the signal-processing circuit.

The auxiliary winding may be a single wire wound on a section of the core which is neither occupied by the primary winding nor by the secondary winding. A tap on the auxiliary winding can easily be made, because the turns do not need to be close to turns of other windings.

According to another aspect of the invention, a transformer having a primary winding and a secondary winding on a core further has an auxiliary winding electrically coupled parallel to said secondary winding, which auxiliary winding has a tap. Such a transformer can advantageously be applied in many signal-processing circuits.

Additional features are defined in the dependent claims.

Advantageously the turns of the auxiliary winding are physically separated from the turns of the primary winding and the secondary winding. Physical separation means that leakage inductances and capacitances between the auxiliary winding, on the one hand, and the primary and/or secondary winding, on the other hand, are sufficiently low to prevent any significant coupling in the frequency band of interest. Accordingly, the input signal transformation is substantially not affected by the auxiliary winding.

Advantageously, the tap of the auxiliary winding is at the center of this winding. This prevents magnetization of the core.

Advantageously, the auxiliary winding has an even number of turns. In that case, the tap is conveniently located.

Advantageously, the magnetic material of the core, on which the windings are located, has its maximum permeability at a frequency which is substantially lower than the frequency of the input signal. In that case, the number of turns of the auxiliary winding and the secondary winding may differ, with only very little reactive current appearing in the transformer.

These and other aspects and advantages of the invention will be apparent from and elucidated with reference to the embodiments described hereinafter.

DETAILED DESCRIPTION OF THE PREFERRED EMBODIMENTS

Figure 1:
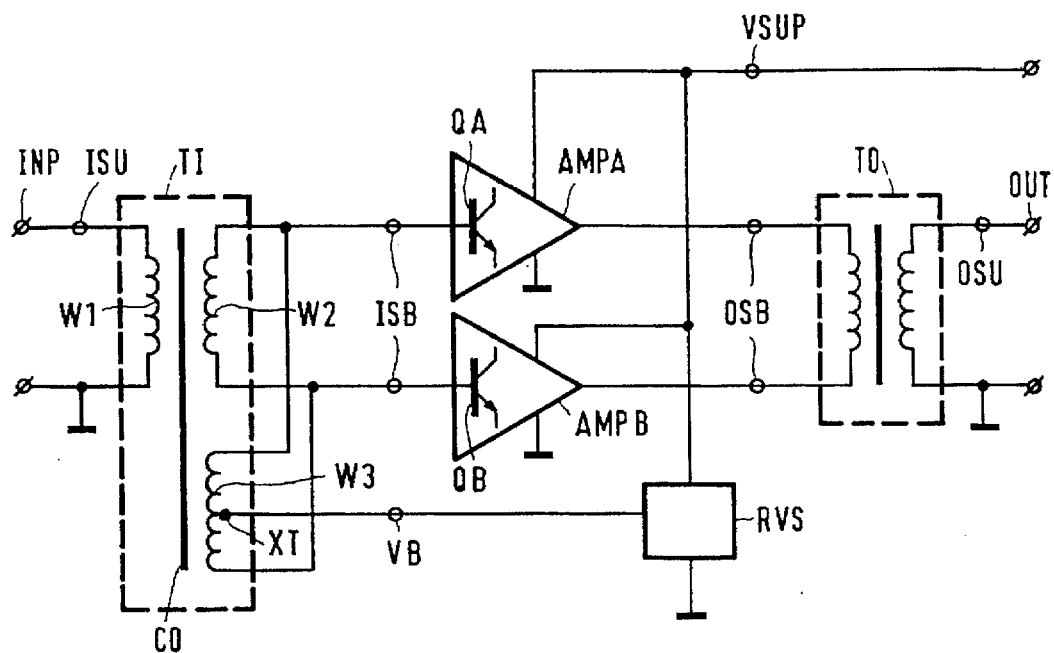
FIG. 1 is a block-schematic diagram of a CATV module according to the invention.

FIG. 1 shows a CATV module embodying the present invention. The CATV module amplifies an unbalanced signal ISU received at input terminal INP to provide an unbalanced output signal OSU at output terminal OUT. The CATV module comprises a wide-band input transformer TI, a pair of amplifiers AMPA and AMPB, respectively, and a wide-band output transformer TO. Input transformer TI transforms the unbalanced signal ISU into a balanced input signal ISB which is supplied to the pair of amplifiers AMPA and AMPB. In response to this balanced input signal ISB, the pair of amplifiers AMPA and AMPB provides a balanced output signal OSB. The output transformer TO transforms this balanced output signal OSB to obtain the unbalanced signal OSU.

More specifically, the input transformer TI shown in FIG. 1 comprises three windings W1, W2 and W3, respectively, on a core CO. The unbalanced signal ISB is applied at winding W1. The winding W1 is inductively and capacitively coupled with the winding W2. As a result, the winding W2 provides the balanced input signal ISB in response to the unbalanced signal ISU over a wide frequency bind. In contrast, the inductive and capacitive coupling between winding W3 and windings W1 and/or W2 is very weak, so as to prevent any signal transfer in the frequency band of interest.

FIG. 1 shows the input transistors QA and QB of the pair of amplifiers AMPA and AMPB, respectively. The bases of these amplifier input transistors QA and QB receive the balanced input signal ISB provided by the winding W2. In order that the pair of amplifiers AMPA and AMPB functions properly, a certain DC bias voltage VB should be applied to the bases. Such a DC bias voltage VB is provided by the reference voltage section RVS shown in FIG. 1. The reference voltage section RVS extracts the DC bias voltage VB from the supply voltage VSUP.

The bases of the amplifier input transistors QA and QB receive the required DC bias voltage VB via the third winding W3 of the input transformer TI. As is shown in FIG. 1, the winding W3 has a tap XT to which the DC bias voltage VB from the reference voltage section RVS is applied. Furthermore, one end of the winding W3 is DC coupled to the base of transistor QA and the other end is DC coupled to the base of transistor QB.

Figure 2:
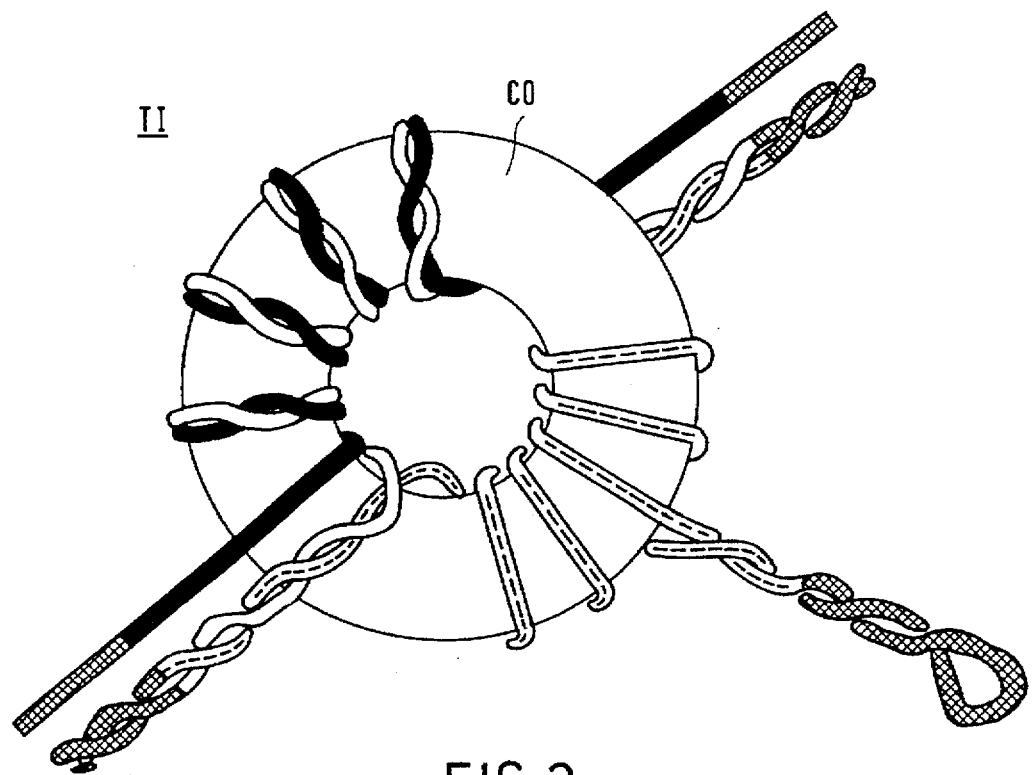
FIG. 2 is a sketch of a transformer according to the invention, also represented in FIG. 1.

FIG. 2 shows a mode of construction of the input transformer TI present in FIG. 1. The core CO is a toroid, preferably of magnetic material of the type 4B1. The wire of the winding W1 is drawn with black filling, the wire of winding W2 is drawn with no filling and the wire of winding W3 is drawn with stripe filling. The square filling of the wires indicates that insulating material is locally removed, so that the wires can make electric contact at these locations.

In FIG. 2, the windings W1 and W2 have 5 turns and the winding W3 has 6 turns. The wires of windings W1 and W2 are twisted in the turns on the core to obtain a wide-band unbalanced-to-balanced signal transfer. In contrast, the turns of the winding W3 are relatively distant from those of windings W1 and W2. The respective ends of the winding W2 and W3 make electric contact with each other. As a result, these windings are electrically coupled in parallel, as is also shown in FIG. 1.

The tap XT on the winding W3 is at the centre of this winding. This means that there is an equal number of turns from the tap XT to one end of the winding and to the other end of the winding. The tap XT may be realised, for example, by initially making one turn of winding W3 substantially larger than the periphery of the core CO. The portion of this turn, which extends from the core CO, is then twisted in itself. Removal of the insulating material at the extending portion—prior to or after twisting—results in an electric contact which forms the tap XT, as is shown in FIG. 2.

Some aspects and advantages of the invention will now be highlighted with reference to the embodiments which have been presented by way of example.

Biasing via the third winding W3 of the input transformer TI, in the CATV module shown in FIG. 1, has several advantages.

First, the winding W3 on the core CO forms a relatively high impedance for the frequencies of interest. As a result, the load impedance for the secondary winding W2 is mainly determined by the base-emitter impedances of the transistors QA and QB. By choosing an appropriate number of turns for the windings W1 and W2, a wide-band transfer from the input INP to the bases of transistors QA and QB can be obtained, with good symmetry in the balanced signal ISB up to high frequencies. As a result of this good symmetry, a practical embodiment of the CATV module shown in FIG. 1 has a very satisfactory low level of second-order distortion.

Secondly, the winding W3 also provides a relatively high impedance between the bases of transistors QA and QB and the output of the reference voltage source RVS which provides the DC bias voltage VB. Only a negligible portion of the balanced signal ISB will leak to signal ground via the reference voltage source RVS. Hence, there is only very little signal loss due to biasing of the bases of transistors QA and QB as shown in FIG. 2. Such a low signal loss is needed to achieve a satisfactory noise figure for the CATV module shown in FIG. 1.

Thirdly, the winding W3 itself is practically noiseless. In addition, due to its relatively high impedance, the winding W3 prevents much of the noise on the DC bias voltage VB produced by the reference voltage source RVS, for example, from contaminating the balanced input signal ISB. All these factors mentioned contribute to the good noise figure of a practical embodiment of the CATV module shown in FIG. 1.

The following design aspects have been taken into account in the embodiments shown in FIGS. 1 and 2. A DC current flows from the reference voltage source RVS to the bases of transistors QA and QB via the winding W3. A DC current flowing through a winding produces a static magnetic field, which can magnetize the core on which this winding is present. To prevent such magnetization of the core CO of the input transformer TI, the tap XT on the winding W3 is substantially at the centre of this winding. As a result, the static magnetic field produced by the base current of transistor QA compensates the static magnetic field produced by the base current of transistor QB. The winding W3 preferably has an even number of turns so that the tap XT is directed outwards.

In the embodiments shown in FIGS. 1 and 2, the optimization with respect to wide-band unbalanced-to-balanced input signal transformation, on the one hand, and preventing core magnetization, on the other hand, has led to a different number of turns for the windings W2 and W3. Since these windings are electrically coupled in parallel, there is a risk of a reactive current flowing through these windings. To prevent a reactive current, the core CO of the input transformer TI mainly comprises magnetic material 4B1.

This material has such a permeability-versus-frequency characteristic that there is substantially no signal transfer from winding W1 to winding W3 in the CATV band of interest. This prevents windings W2 and W3 from behaving as two signal sources with voltages of unequal value in parallel, which would cause a reactive current to flow.

In summary, a CATV amplifier module has been described by way of example, in which an input transformer TI transforms an unbalanced input signal ISU into a balanced input signal ISB, which is supplied to a pair of amplifiers AMPA, AMPB. In addition to windings W1, W2 for input signal transformation, the core CO of the transformer TI is provided with an auxiliary winding W3 for biasing the pair of amplifiers AMPA, AMPB. A DC bias voltage VB is supplied to a tap XT on the auxiliary winding W3 whose ends are DC coupled to the input transistors QA, QB of the pair of amplifiers AMPA, AMPB.

It goes without saying that many alternative implementations are possible within the scope of the invention as claimed.

Instead of CATV amplifier modules, the invention may be applied, for example, in receiver mixer circuits. In general, the invention may be used in any type of signal-processing circuit having an input signal transformer.

Instead of amplifiers or transistors, diodes or tubes can be biased by means of the auxiliary winding. In general, the invention may be used to bias any type of electric device which receives an input signal via a transformer.

Circuit parameters, which have been presented by way of example, may be different in alternative implementations. For example, a different number of turns of the windings may be preferred in an amplifier module for a frequency band other than for CATV. Likewise, core material other than 4B1 may be used to achieve optimum practical results.

Any reference signs between parentheses in a claim cannot be construed as limiting the claim concerned.

What is claimed is:

1. A signal-processing circuit comprising a transformer (TI) having a magnetic core (CO) provided with a primary winding (WI) for receiving an input signal (ISU) and a secondary winding (W2) inductively and capacitively coupled thereto for supplying a transformed input signal (ISB) to a pair of electric devices (QA, QB) in said signal-processing circuit, characterized in that the magnetic core (CO) is further provided with an auxiliary winding (W3) the ends of which are DC coupled to said pair of electric devices (QA, QB) and in parallel with said secondary winding (W2), said auxiliary winding (W3) having a tap (XT) which is DC coupled to a voltage source (RVS) for biasing said pair of electric devices (QA, QB).

2. A Signal-processing circuit as claimed in claim 1, wherein the turns of the auxiliary windings (W3) on said core (CO) are physically separated from the turns of said primary winding and said secondary winding (W1, W2).

3. A signal-processing circuit as claimed in claim 1, wherein said tap (XT) is at the centre of said auxiliary winding (W3).

4. A signal-processing circuit as claimed in claim 3, wherein said auxiliary winding (W3) has an even number of turns.

5. A signal-processing circuit as claimed in claim 1, wherein the magnetic material of the core (CO) has its maximum permeability at a frequency which is substantially lower than the frequency of said input signal.

6. A transformer (TI) having a primary winding (WI) and a secondary winding (W2) inductively and capacitively coupled thereto on a core (CO), which transformer (TI) further has an auxiliary winding (W3) electrically DC coupled in parallel with said secondary winding (W2), which auxiliary winding (W3) has a tap (XT).

7. A transformer as claimed in claim 6, wherein the turns of the auxiliary winding are physically separated from the turns of said primary winding and said secondary winding.

* * * * *